(12) United States Patent
Sonoda et al.

(10) Patent No.: US 6,984,858 B2
(45) Date of Patent: Jan. 10, 2006

(54) SEMICONDUCTOR DEVICE AND MANUFACTURING METHOD THEREOF

(75) Inventors: Masahisa Sonoda, Yokkaichi (JP); Tadashi Iguchi, Yokkaichi (JP); Hiroaki Tsunoda, Yokkaichi (JP); Eiji Sakagami, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 320 days.

(21) Appl. No.: 10/293,254

(22) Filed: Nov. 14, 2002

(65) Prior Publication Data

US 2004/0053502 A1 Mar. 18, 2004

(30) Foreign Application Priority Data

Sep. 17, 2002 (JP) ..................... P2002-270353

(51) Int. Cl.
*H01L 27/108* (2006.01)

(52) U.S. Cl. ................ 257/296; 257/314; 257/315; 257/316; 257/321; 438/700; 438/701; 438/694; 438/695; 438/696

(58) Field of Classification Search ................ 257/296, 257/314–316, 321; 438/700, 701, 695, 696, 438/712, 480, 257, 265, 694
See application file for complete search history.

(56) References Cited

U.S. PATENT DOCUMENTS

| | | | | |
|---|---|---|---|---|
| 5,283,201 A | * | 2/1994 | Tsang et al. | ................ 438/138 |
| 6,130,452 A | * | 10/2000 | Lu et al. | ................ 257/315 |
| 6,133,106 A | * | 10/2000 | Evans et al. | ................ 438/299 |
| 6,146,975 A | * | 11/2000 | Kuehne et al. | ............. 438/437 |
| 6,294,430 B1 | * | 9/2001 | Fastow et al. | ............. 438/264 |
| 6,342,715 B1 | | 1/2002 | Shimizu et al. | |
| 6,417,085 B1 | * | 7/2002 | Batra et al. | ................ 438/591 |

FOREIGN PATENT DOCUMENTS

| | | |
|---|---|---|
| JP | 9-8156 | 1/1997 |
| JP | 9-181166 | 7/1997 |
| JP | 10-189920 | 7/1998 |
| JP | A 11-26731 | 1/1999 |
| JP | 2000-246480 | 9/2000 |
| JP | 2000-342540 | 12/2000 |
| JP | 2002-208629 | 7/2002 |
| JP | 2002-313967 | 10/2002 |

OTHER PUBLICATIONS

Iguchi et al.; "Semiconductor Device and Method of Manufacturing a Semiconductor device"; U.S. Appl. No. 10/180,463, filed Jun. 27, 2002.

Notice of Reasons of Rejection, issued by the Japanese Patent Office, dated Nov. 4, 2004, for Japanese Patent Application No. 2002–270353, and English–language translation thereof.

Notice of Final Rejection, issued by the Japanese Patent Office, dated Feb. 3, 2005, for Japanese Patent Application No. 2002–270353, and English–language translation thereof.

* cited by examiner

*Primary Examiner*—Nathan J. Flynn
*Assistant Examiner*—Remmon R. Fordé
(74) *Attorney, Agent, or Firm*—Finnegan, Henderson, Farabow, Garrett & Dunner, L.L.P.

(57) ABSTRACT

In a semiconductor device including a plurality of element regions and an element isolation region based on STI (shallow trench isolation) which electrically isolates the element regions from each other, each of the element regions includes; a channel region; source/drain regions formed to sandwich the channel region in a horizontal direction; a gate insulation film which is formed on the channel region and in which an angle of a bird's beak is 1 degree or smaller, the bird's beak being formed from a side of the element isolation region on a surface opposite a surface facing the channel region in a horizontal direction substantially perpendicular to the direction in which the source/drain region sandwich the channel region; and a gate electrode layer formed on the gate insulation film.

9 Claims, 12 Drawing Sheets

SEMICONDUCTOR DEVICE AND MANUFACTURING METHOD THEREOF

CROSSREFERENCE TO RELATED APPLICATIONS

This application is based upon and claims the benefit of priority from the prior Japanese Patent Application No. 2002-270353 filed on Sep. 17, 2002; the entire contents of which are incorporated herein by reference.

BACKGROUND

1. Field of the Invention

The present invention relates to a semiconductor device including field-effect transistors having a gate insulation film and a manufacturing method thereof, and more particularly, to the semiconductor device and the manufacturing method thereof suitable for further shrinking the transistor size.

2. Description of the Related Art

As the structure used for a semiconductor device in which field-effect transistors having a gate insulation film are integrated which structure is to electrically isolate regions in which these transistors are disposed (element isolation), there is a structure disclosed in, for example, Japanese Patent Laid-open Application No. Hei 9-181166. This Japanese Patent Laid-open Application No. Hei 9-181166 describes the structure in which element isolation is achieved by forming trenches in a substrate and burying an oxide in the trenches, instead of by selective oxidation.

The structure using an insulator buried in the trenches as the element isolation structure is becoming a mainstream structure as the scaling down of elements progresses. Methods of forming the trenches and the order of the trench forming processes vary depending on the kinds or the like of elements to be formed.

Among such semiconductor devices, a semiconductor device in which trenches for element isolation regions are formed in a substrate to pass through a gate insulation film after the gate insulation film and so on are formed on the substrate has an advantage that the processes can be simplified and, for example, the structure for avoiding the concentration of electric field on an end part of the gate insulation film can be easily achieved. Here, anisotropic etching, for example, an RIE (reactive ion etching) method is adoptable for forming the trenches.

In the RIE method, an unnecessary product (by-product) is generally generated on sidewalls of the formed trenches. Therefore, it is more preferable to carry out a removing treatment of this unnecessary product as an after-treatment in manufacturing the semiconductor device in which the field-effect transistors having the gate insulation film are integrated. In this case, however, since the sidewalls of the formed trenches include side surfaces of the gate insulation film and so on, the prevention of an adverse effect on the gate insulation film has to be considered. Even the same operation has a relatively bigger influence on the gate insulation film as the area of the gate insulation film is smaller (in other words, as the elements are made more scaled down).

SUMMARY

A semiconductor device according to an aspect of the present invention is a semiconductor device comprising a plurality of element regions and an element isolation region based on STI (shallow trench isolation) which electrically isolates the element regions from each other, each of the element regions comprising: a channel region; source/drain regions formed to sandwich the channel region in a horizontal direction; a gate insulation film which is formed on the channel region and in which an angle of a bird's beak is 1 degree or smaller, the bird's beak being formed from a side of the element isolation region on a surface opposite a surface in contact with the channel region in a horizontal direction substantially perpendicular to the direction in which the source/drain regions sandwich the channel region; and a gate electrode layer formed on the gate insulation film.

A semiconductor device according to another aspect of the present invention is a semiconductor device comprising a plurality of element regions and an element isolation region based on STI which electrically isolates the element regions from each other, each of the element regions comprising: a channel region; source/drain regions formed to sandwich the channel region in a horizontal direction; a gate insulation film having a side surface and formed on the channel region with this side surface being continuous with a side surface of the channel region facing a side of the element isolation region; and a gate electrode layer having a side surface and formed on the gate insulation film with this side surface being continuous with the side surface of the gate insulation film facing the side of the element isolation region.

A semiconductor device manufacturing method according to one aspect of the present invention comprises: forming a gate insulation film on a substrate; forming a gate electrode layer on the gate insulation film; forming a trench structured to pass through the gate electrode layer and the gate insulation film and to dig into the substrate; and burying an insulation film in the trench to be in direct contact with a side surface of the gate electrode layer in the trench and a side surface of the substrate in the trench.

BRIEF DESCRIPTION OF THE DRAWINGS

The present invention will be described with reference to the drawings, but these drawings are to be considered in all respects as illustrative and not restrictive of the scope of the present invention.

Figure 1:
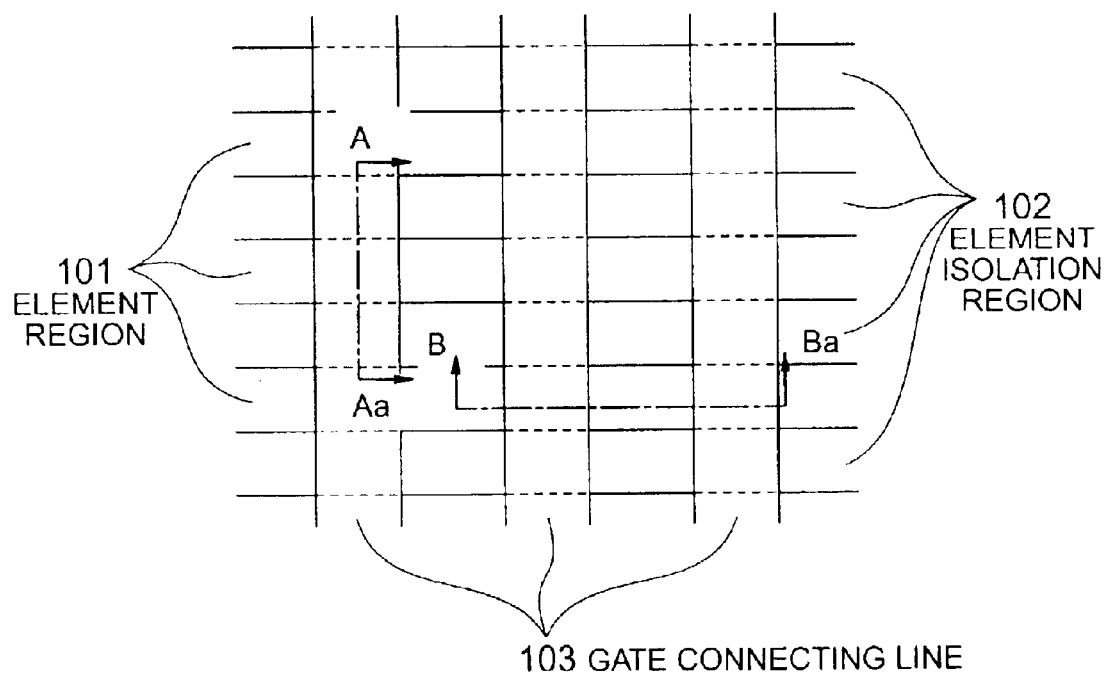
FIG. 1 is a plan view schematically showing the structure of a nonvolatile semiconductor memory device according to one embodiment of the present invention.

DETAILED DESCRIPTION
(Explanation of Embodiment)

In a semiconductor device according to one aspect of the present invention, the angle of a bird's beak formed on a surface in contact with a gate electrode layer of an element isolation region side in a gate insulation film is 1 degree or smaller, which is extremely small. Accordingly, the depth of the bird's beak is very small so that the gate insulation film has a more uniform shape (thickness). Consequently, even when the gate insulation film has a small area, the uniformity thereof is maintained, which makes it possible to achieve further scaling down of transistors.

According to one of the modes of an embodiment, the gate electrode layer is in an electrically floating state. In other words, the gate insulation film is made to be a tunnel insulation film, thereby generating a nonvolatile memory state. The aforesaid one aspect of the present invention is also applicable as such an element.

According to another mode of the embodiment, the gate electrode layer is a polycrystalline silicon film. The polycrystalline silicon film, when taken into a gate insulation film side due to oxidation, becomes a cause of forming the bird's beak of the gate insulation film. According to the aforesaid one aspect of the present invention, the bird's beak is controlled to be small in such a case as well.

According to still another mode of the embodiment, a length of the gate insulation film is 200 nm or shorter in the horizontal direction substantially perpendicular to the direction in which the source/drain regions sandwich the channel region. The aforesaid one aspect of the present invention is also suitable for such a small gate insulation film.

According to yet another mode of the embodiment, in the gate insulation film, a depth of the bird's beak from the side of the element isolation region is 10% or less relative to a length of the gate insulation film in the horizontal direction substantially perpendicular to the direction in which the source/drain regions sandwich the channel region. According to the aforesaid one aspect of the present invention, the depth of the formed bird's beak can be controlled to be as small as this length.

In a semiconductor device according to another aspect of the present invention, a sidewall of a trench, which is a side surface of a substrate, for an element isolation region, a side surface of a gate insulation film facing a side of the element isolation region, and a side surface of a gate electrode layer facing a side of the element isolation region constitute a substantially continuous plane. In other words, treatment after the formation of a trench is simplified as much as possible in order to constitute such a continuous plane. Since this simplification makes it possible to maintain the gate insulation film in a more uniform shape (thickness), the uniformity of the gate insulation film is maintained even if the area thereof is small. Consequently, further scaling down of transistors is achieved.

To this another aspect of the present invention, the case when the gate electrode layer is in an electrically floating state, the case when the gate electrode layer is a polycrystalline film, or the case when a length of the gate insulation film is 200 nm or shorter in the horizontal direction substantially perpendicular to the direction in which the source/drain regions sandwich the channel region is similarly applicable as modes of an embodiment.

In a semiconductor device manufacturing method according to one aspect of the present invention, a trench structured to pass through a gate electrode layer and a gate insulation film and to dig into a substrate is formed, and an insulation film is buried in the trench to be in direct contact with a side surface of the gate electrode layer in this trench and a side surface of the substrate in the trench. In other words, treatment after the formation of the trench is simplified as much as possible in order to bury the insulation film to be in direct contact with the side surface of the gate electrode layer in the trench and the side surface of the substrate in the trench. Since this simplification makes it possible to maintain the gate insulation film in a more uniform shape (thickness), the uniformity of the gate insulation film is maintained even if the area thereof is small. Consequently, further scaling down of transistors is achieved.

As one mode of an embodiment, in forming the gate electrode layer on the gate insulation film, a polycrystalline silicon layer is formed as the gate electrode layer. As another mode of the embodiment, in forming the trench structured to pass through the gate electrode layer and the gate insulation film and to dig into the substrate, a plurality of trenches substantially parallel to each other are formed, and the trenches are formed to make an internal dimension between the trenches parallel and adjacent to each other be 200 nm or smaller. This semiconductor manufacturing method manufactures the semiconductor device in each of the above modes of the embodiment.

Based on the description above, an embodiment of the present invention will be explained below with reference to the drawings, taking a nonvolatile semiconductor memory device for example. FIG. 1 is a plan view schematically showing the structure of a nonvolatile semiconductor memory device according to one embodiment of the present invention. As is shown in the drawing, this nonvolatile semiconductor memory device has cells (MOS transistors having floating gate electrodes) as memory elements arranged in an array.

Specifically, element regions 101 and element isolation regions 102 isolating these element regions 101 from each other are alternately arranged in stripes, one stripe of the element region 101 including a plurality of cells in a horizontal direction in the drawing. Gate connecting lines 103 connecting control gate electrodes to each other are also formed in stripes in a direction perpendicular to the direction in which the element regions 101 extend.

In each of the intersections of the gate connecting lines 103 and the element regions 101, a floating gate electrode (not shown) is buried, and a substrate region located further below the floating gate is a channel. Each of the intersections of the element regions 101 and the regions between the gate connecting lines 103 is a source or a drain region (hereinafter, referred to as a source/drain region).

Manufacturing processes of such a nonvolatile semiconductor memory device will be explained below using FIG. 2A and FIG. 2B to FIG. 8A and FIG. 8B. FIG. 2A and FIG. 2B to FIG. 8A and FIG. 8B are cross sectional process views schematically showing manufacturing processes of the nonvolatile semiconductor memory device according to the embodiment of the present invention. FIGs. A in FIG. 2A and FIG. 2B to FIG. 8A and FIG. 8B are cross sectional views taken along the A–Aa line in FIG. 1, and FIGs. B in the same are cross sectional views taken along the B–Ba line in FIG. 1. The same reference numerals and symbols will be used to designate the same or similar portions in FIG. 2A and FIG. 2B to FIG. 8A and FIG. 8B.

Figure 2A:
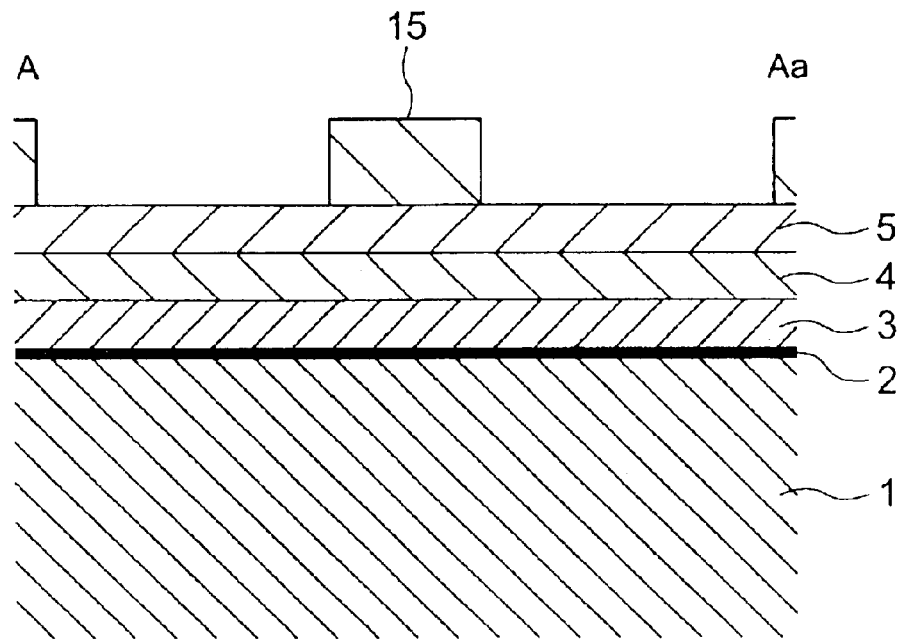
FIG. 2A and FIG. 2B are cross sectional process views schematically showing manufacturing processes of the nonvolatile semiconductor memory device according to the embodiment of the present invention.
Figure 2B:
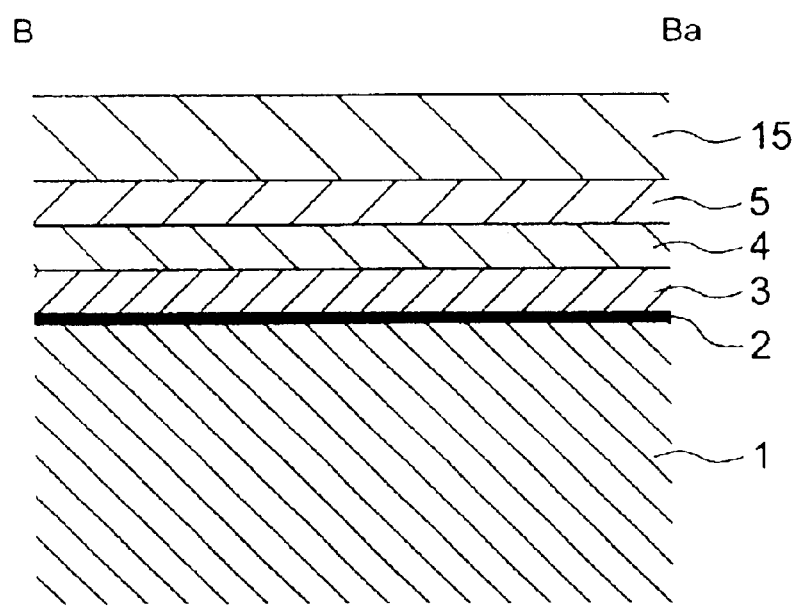

First, processes to obtain the state shown in FIG. 2A and FIG. 2B are carried out. Specifically, a semiconductor substrate (hereinafter, sometimes referred to simply as a substrate) 1 is heated in an $O_2$ atmosphere at 800° C. and a first gate insulation film 2 having a thickness of, for example, 10 nm is formed on the substrate 1. Subsequently, a polycrystalline silicon film 3 (to be a part of a floating gate electrode) having a thickness of, for example, 60 nm is deposited on the first gate insulation film 2 by a pressure-reduced CVD method, a silicon nitride film 4 having a thickness of, for example, 100 nm is further deposited on the polycrystalline silicon film 3 by the pressure-reduced CVD method, and a silicon oxide film 5 having a thickness of, for example, 150 nm is deposited on the silicon nitride film 4. Next, a photo resist 15 is formed on the silicon oxide film 5, and this photo resist 15 is processed to a stripe pattern in the B–Ba direction using a photo-etching technique (FIG. 2A, FIG. 2B).

Figure 3A:
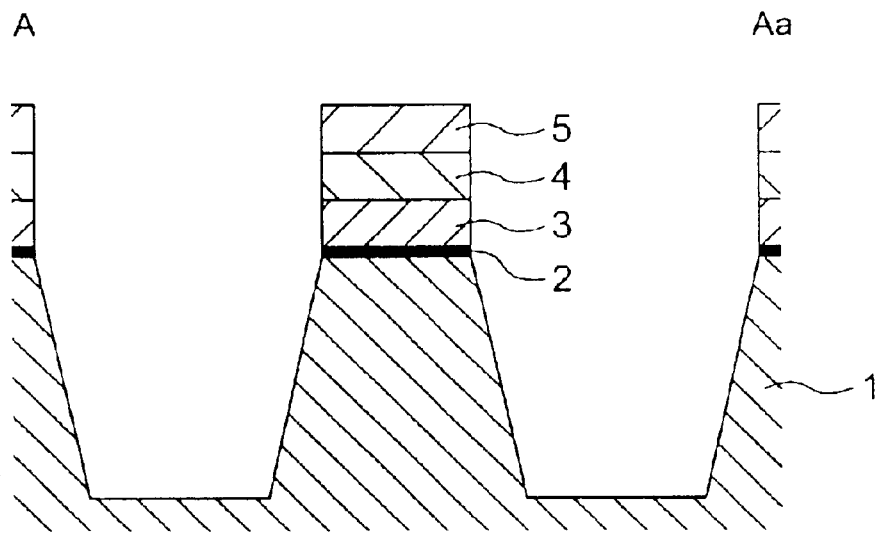
FIG. 3A and FIG. 3B, which are views subsequent to FIG. 2A and FIG. 2B, are cross sectional process views schematically showing the manufacturing processes of the nonvolatile semiconductor memory device according to the embodiment of the present invention.
Figure 3B:
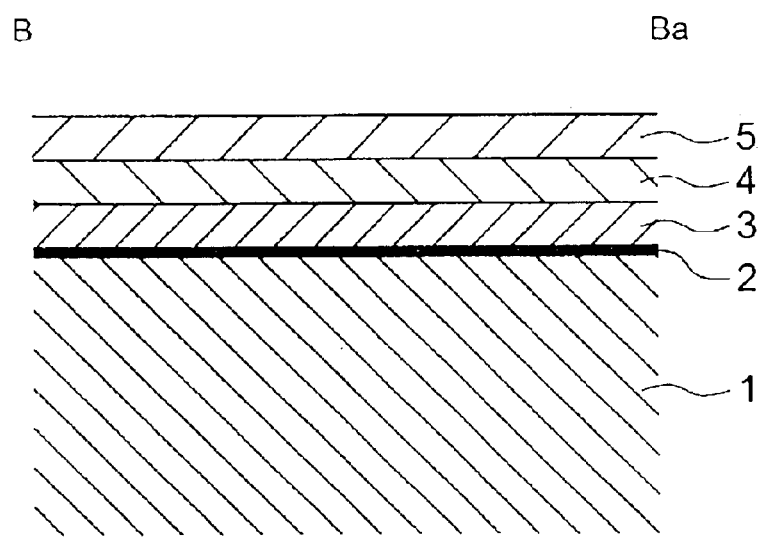

Next, processes to obtain the state shown in FIG. 3A and FIG. 3B are carried out. Specifically, using the processed photo resist 15 as a mask, the silicon oxide film 5 and the silicon nitride film 4 are processed and etched by an RIE method. Further, after the whole structure including the substrate 1 is soaked in an $O_2$ plasma to remove the resist 15, the polycrystalline silicon film 3 is processed and etched by the RIE method, using the processed silicon oxide film 5 as a mask, and subsequently, using the same mask, the first gate insulation film 2 and the semiconductor substrate 1 are processed and etched by the RIE method. Through these processes, silicon trenches are formed in the semiconductor substrate 1 (FIG. 3A, FIG. 3B). These trenches become trenches for element isolation based on STI. Note that a region on the substrate 1 facing the polycrystalline silicon film 3 across the first gate insulation film 2 is a region to be a channel.

In the aforesaid trench obtained by the RIE method using the silicon oxide film 5 as the mask, a product (by-product) is generated on sidewalls and a bottom surface thereof, and therefore, this product is removed by VPC (vapor phase cleaning) at 80° C. using hydrofluoriic acid as a chemical solution. In order to remove this by-product, such a method can be used in which the whole structure including the substrate 1 is further heated in the $O_2$ atmosphere at, for example, 1000° C., to form a silicon oxide film having a very small thickness (several nm in thickness) on the sidewalls and the bottom surface of the trench, but in this embodiment, the formation of the silicon oxide film by such heating is not carried out. The reason will be stated later. The hydrofluoric acid may be brought closer to a liquid state by the decrease in the temperature applied for VPC (for example, 60° C.) or the like in accordance with the elimination of the formation of the silicon oxide film, thereby improving an etching effect.

Alternatively, in order to remove the aforesaid by-product, dilute hydrofluoric acid treatment and further acid treatment may be carried out to form an oxide film on the sidewalls and the bottom surface of the trench, the oxide film having a smaller thickness order (for example, zero point several nm in thickness) than a thickness obtained when the high-temperature oxidation is carried out. When only the dilute hydrofluoric acid treatment is carried out, unnecessary water glass may possibly be generated, but the acid treatment can remove this water glass.

Figure 4A:
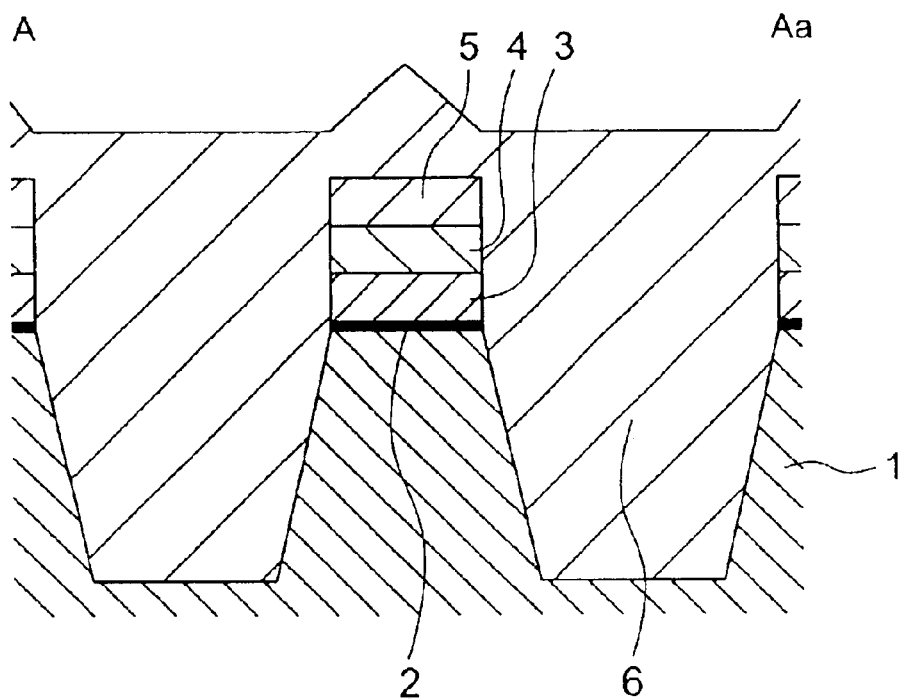
FIG. 4A and FIG. 4B, which are views subsequent to FIG. 3A and FIG. 3B, are cross sectional process views schematically showing the manufacturing processes of the nonvolatile semiconductor memory device according to the embodiment of the present invention.
Figure 4B:
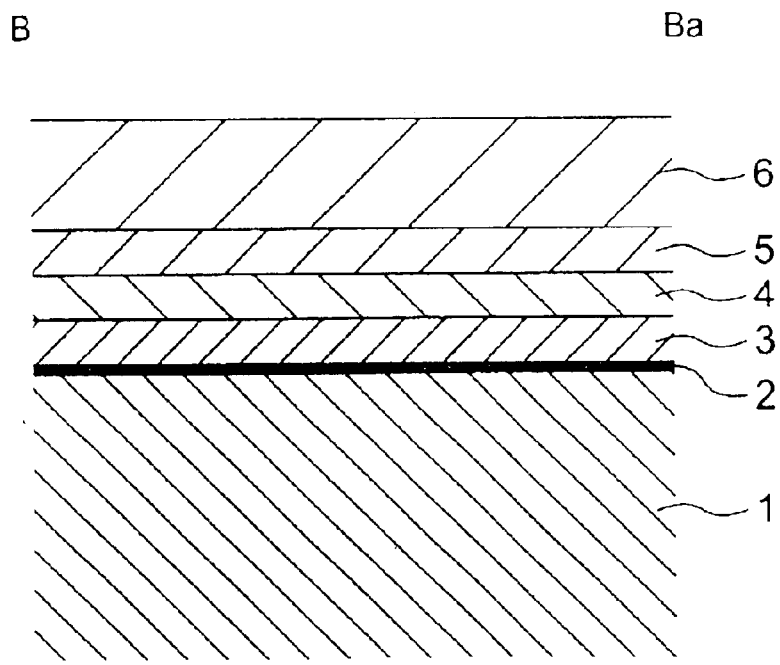

Next, processes to obtain the state shown in FIG. 4A and FIG. 4B are carried out. Specifically, a silicon oxide film (insulation film) 6 having a thickness of, for example, 600 nm is deposited on the entire surface by an HDP (high density plasma) method. At this time, the silicon oxide film 6 is deposited to be in direct contact with side surfaces of the polycrystalline silicon film 3 and side surfaces of the substrate 1. This is because the silicon oxide film is not formed on the sidewalls and the bottom surface of the trench by the thermal treatment in advance as described above, in other words, the polycrystalline silicon film 3, the first gate insulation film 2, and the substrate 1 are formed so that the respective side surfaces thereof have a continuous shape.

Figure 5A:
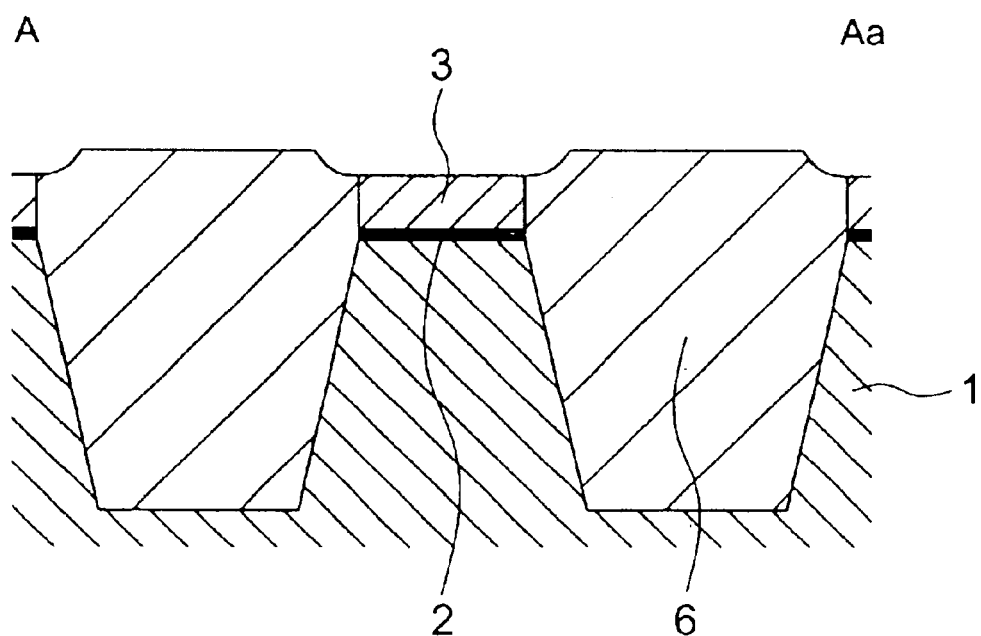
FIG. 5A and FIG. 5B, which are views subsequent to FIG. 4A and FIG. 4B, are cross sectional process views schematically showing the manufacturing processes of the nonvolatile semiconductor memory device according to the embodiment of the present invention.
Figure 5B:
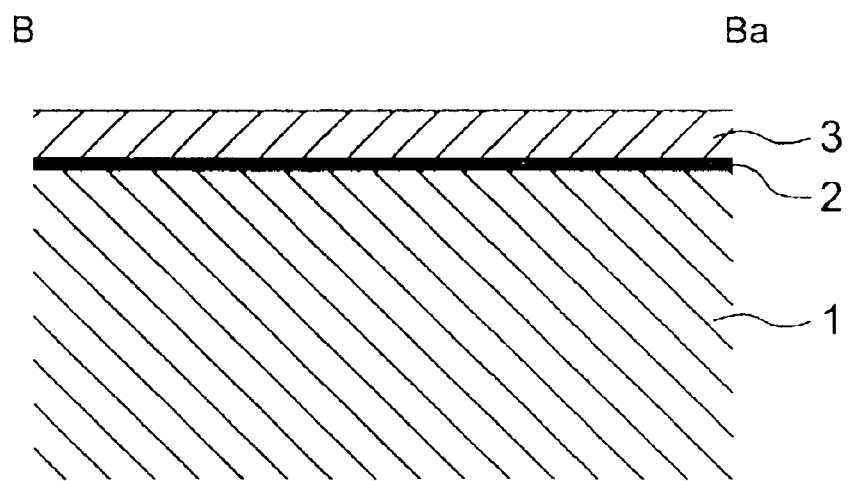

Next, processes to obtain the state in FIG. 5A and FIG. 5B are carried out. Specifically, the silicon oxide film 6 is polished to be flattened by a CMP (chemical mechanical polishing) method until the silicon nitride film 4 is exposed, and heating at 900° C. in a nitride atmosphere is carried out. Further, buffered hydrofluoric acid treatment is carried out, for example, for 10 seconds, the upper surface of the silicon oxide film 6 is etched to some degree, and the silicon nitride film 4 is removed by phosphoric acid treatment at, for example, 150° C. Further, the silicon oxide film 6 is etched by, for example, 20 nm, by dilute hydrofluoric acid treatment. STI structures having the silicon oxide film 6 are formed as the element isolation regions through the processes so far (FIG. 5A, FIG. 5B).

Figure 6A:
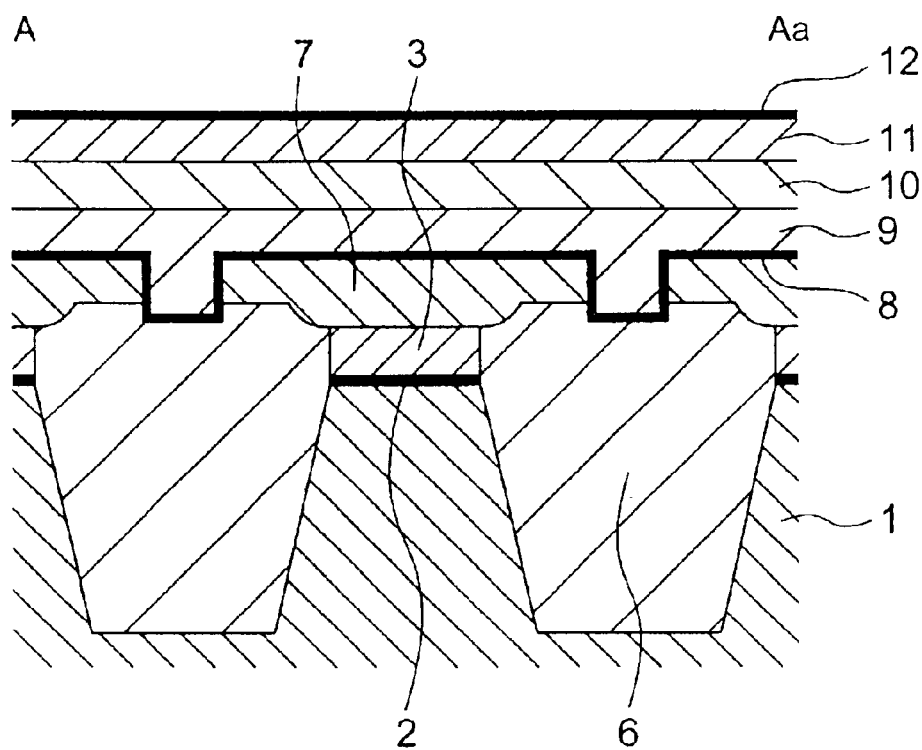
FIG. 6A and FIG. 6B, which are views subsequent to FIG. 5A and FIG. 5B, are cross sectional process views schematically showing the manufacturing processes of the nonvolatile semiconductor memory device according to the embodiment of the present invention.
Figure 6B:
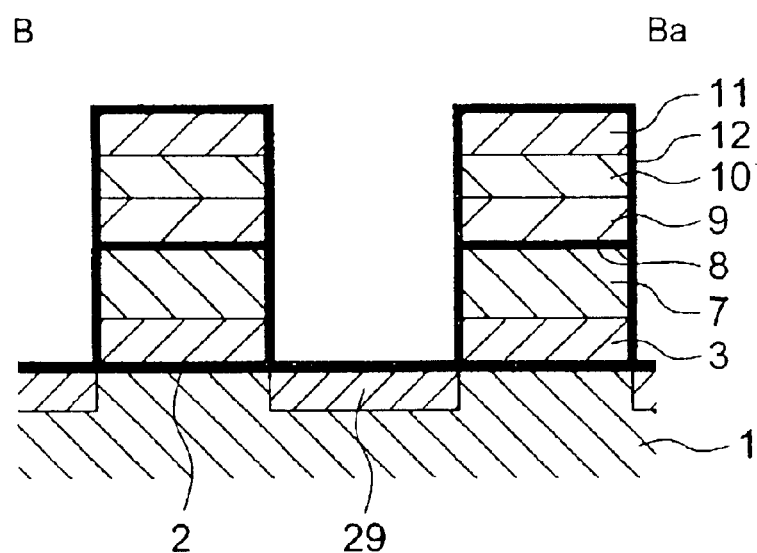

Next, processes to obtain the state in FIG. 6A and FIG. 6B are carried out. Specifically, a polycrystalline film 7 (to be the other part of the floating gate) having a thickness of, for example, 100 nm with phosphorus added thereto is deposited on the entire surface by the pressure-reduced CVD method. A photo resist (not shown) formed on the polycrystalline silicon film 7 is then processed into a desired strip pattern (B–Ba direction) using the photo-etching technique. Further, using this photo resist as a mask, the polycrystalline silicon film 7 is processed and etched by the RIE method to form grooves until at least the silicon oxide film 6 is exposed in the grooves. Through this process, the polycrystalline film 7 being a part of the floating gate is divided in the A–Aa direction according to each of MOS transistors to be formed.

Next, after the above-mentioned photo resist is removed, a second gate insulation film 8 having an ONO (Oxide: 5 nm, SiN: 5 nm, Oxide: 5 nm) structure having a total thickness of, for example, 15 nm is deposited on the polycrystalline silicon film 7 by the pressure-reduced CVD method. Then, a polycrystalline silicon film 9 (to be a part of a control gate electrode) having a thickness of, for example, 100 nm with phosphorus added thereto is deposited on the polycrystalline silicon film 7 by the pressure-reduced CVD method, further a tungsten silicide (Wsi) film 10 (to be the other part of the control gate electrode) having a thickness of, for example, 100 nm is deposited thereon by a PVD method, and thereafter, a silicon oxide film 11 to be a mask material for processing gate electrodes (including the control gate electrode) is deposited until it has a thickness of, for example, 230 nm by the pressure-reduced CVD method.

Next, a photo resist (not shown) is formed on the silicon oxide film 11 and processed into a desired stripe pattern (A–Aa direction) using a general photo-etching technique. Then, using the processed photo resist as a mask, the silicon oxide film 11 is processed by the RIE method. Thereafter, the photo resist is removed by $O_2$ plasma treatment and mixed solution treatment of sulfuric acid and hydrogen peroxide.

Next, using the silicon oxide film 11 processed in the above manner as a mask, the tungsten silicide film 10, the polycrystalline silicon film 9, the second gate insulation film 8, the polycrystalline silicon film 7, and the polycrystalline silicon film 3 are processed and etched by the RIE method to form gate structures isolated from each other. In this state, the gate structures formed on the first gate insulation film 2 are isolated from each other in the B–Ba direction (by the grooves in the A–Aa direction) to correspond the respective MOS transistors.

Next, heating in a nitride atmosphere, for example, at 800° C. for 120 seconds is carried out, and heating in an oxide atmosphere at 100° C. is further carried out to form a silicon oxide film 12 having a thickness of, for example, 10 nm over the side surfaces of the above-mentioned gate structures. Further, a dorpant is implanted by an ion implanting method onto the substrate 1 from the grooves extending in the A–Aa direction which have been processed and formed to form source/drain regions 29. Through the above processes, the state shown in FIG. 6A and FIG. 6B is obtained.

Figure 7A:
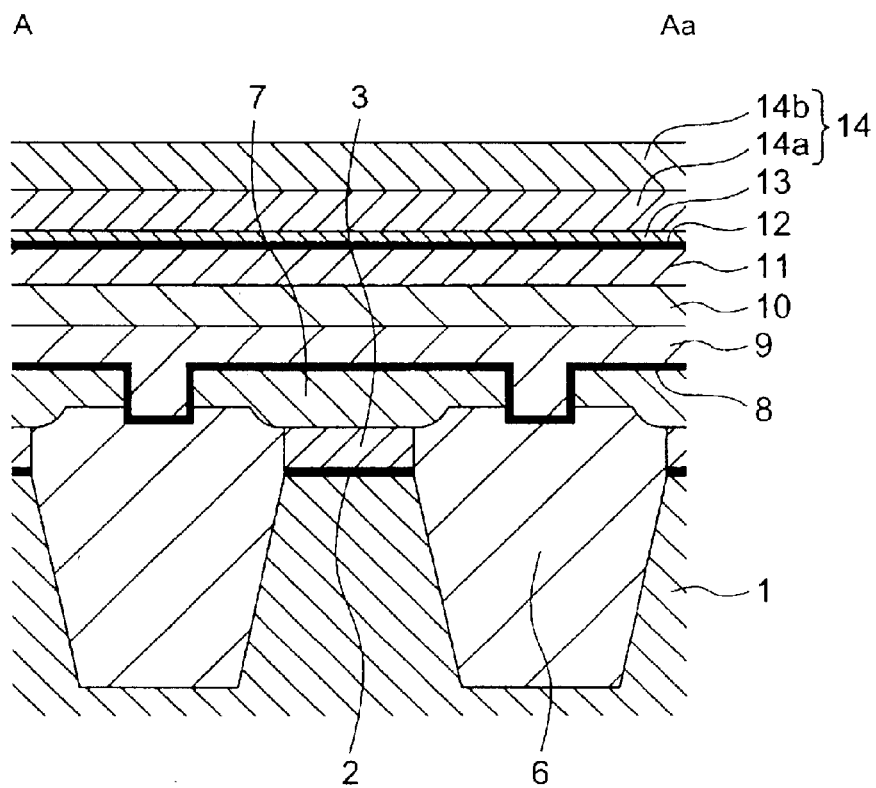
FIG. 7A and FIG. 7B, which are views subsequent to FIG. 6A and FIG. 6B, are cross sectional process views schematically showing the manufacturing processes of the nonvolatile semiconductor memory device according to the embodiment of the present invention.
Figure 7B:
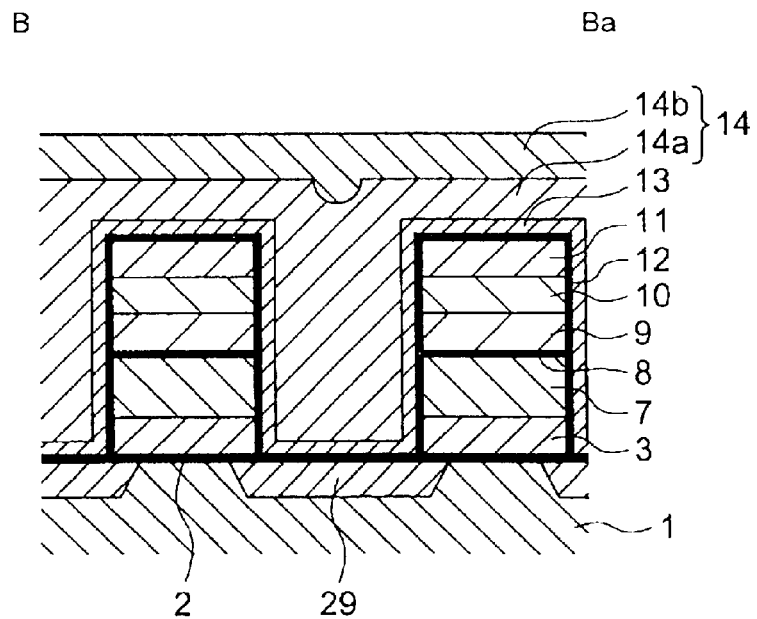

Next, processes to obtain the state shown in FIG. 7A and FIG. 7B are carried out. Specifically, a silicon nitride film 13 having a thickness of, for example, 40 nm is deposited to be overlaid on the exposed surface by the pressure-reduced CVD method. Then, a first insulation film (BPSG film: boro-phospho silicate glass film) 14a having a thickness of, for example, 400 nm is deposited over the entire surface by an atmospheric-pressure CVD method, and thereafter, this first insulation film 14a is made to reflow by thermal treatment in the nitride atmosphere, for example, at 850° C. for 30 minutes. Subsequently, a second insulation film (BSPG film) 14b having a thickness of, for example, 300 nm is additionally deposited, and thereafter, this second insulation film 14b is made to reflow by thermal treatment in the nitride atmosphere, for example, at 850° C. for 30 minutes. In these thermal treatments, the dorpant implanted onto the substrate 1 is diffused at the same time to form overlapping portions under the polycrystalline silicon film 3 (FIG. 7A, FIG. 7B). (Note that hereinafter, the first insulation film 14a and the second insulation film 14b will be comprehensively referred to as an insulation film 14.)

Figure 8A:
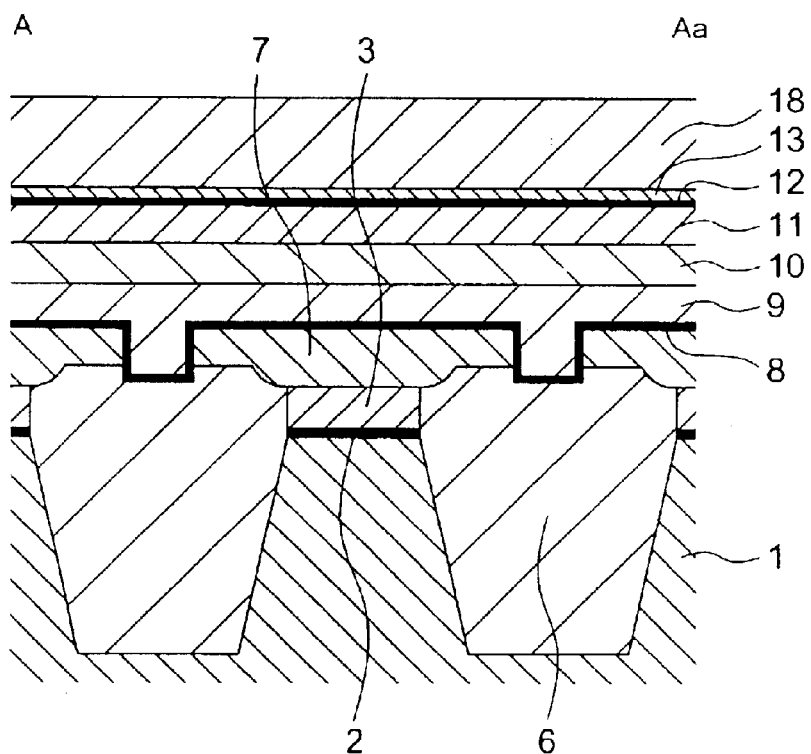
FIG. 8A and FIG. 8B, which are views subsequent to FIG. 7A and FIG. 7B, are cross sectional process views schematically showing the manufacturing processes of the nonvolatile semiconductor memory device according to the embodiment of the present invention.
Figure 8B:
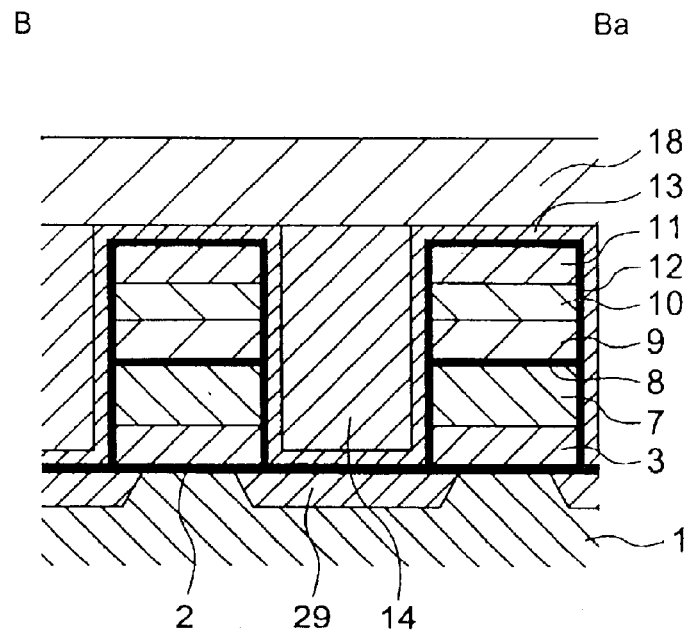

Next, processes to obtain the state shown in FIG. 8A and FIG. 8B are carried out. Specifically, the insulation film 14 is flattened by the CMP method until the silicon nitride film 13 on the gate electrode structures are exposed. Then, a silicon oxide film 18 having a thickness of, for example, 300 nm is deposited over the entire surface by a plasma CVD method (FIG. 8A, FIG. 8B). Thereafter, the processes of forming contacts to necessary portions among the source/drain regions and the control gate electrodes, forming wiring patterns connecting to these contacts, and so on are carried out by processing the insulation film 14 and the silicon oxide film 18, though these processes are omitted in the drawings. Through these processes, the nonvolatile semiconductor memory device according to this embodiment is obtainable.

Figure 9A:
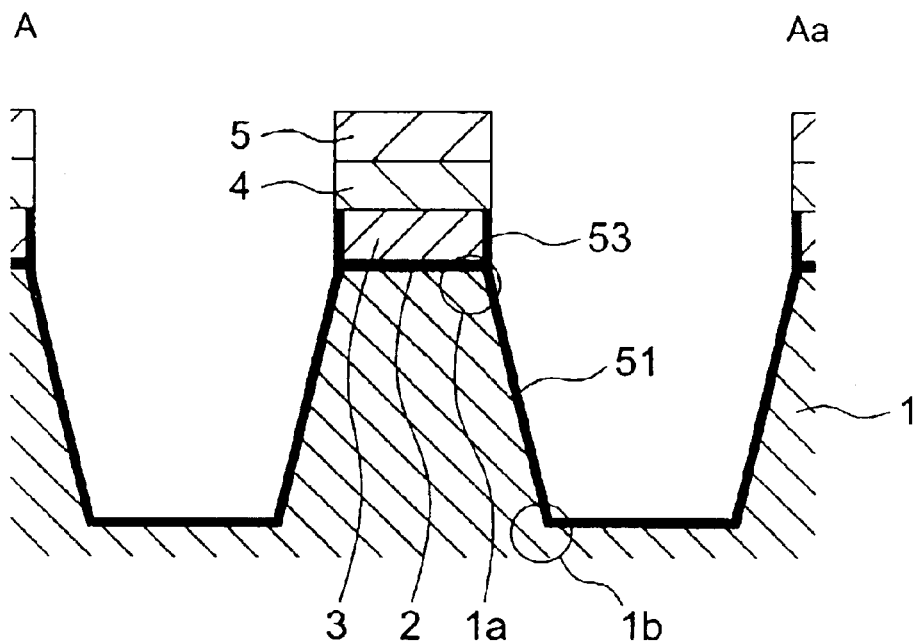
FIG. 9A and FIG. 9B are cross sectional views to explain items to be considered in the state shown in FIG. 3A and FIG. 3B (the state in which STI trenches are formed).
Figure 9B:
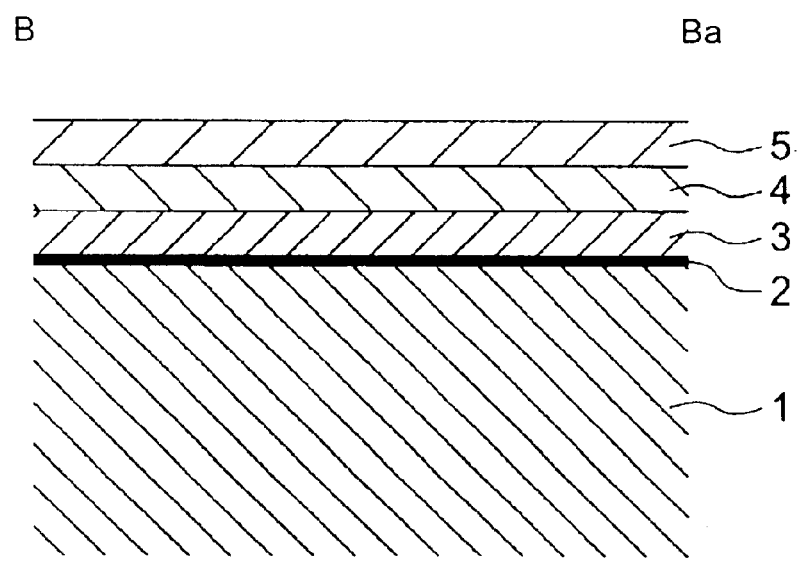

FIG. 9A and FIG. 9B are cross sectional views to explain items to be considered in the state shown in FIG. 3A and FIG. 3B explained above (the state in which the STI trenches are formed). In FIG. 9A and FIG. 9B, the same reference numerals and symbols are used to designate the same or similar portions as those previously explained. FIGs. A and FIGs. B show the same as in FIG. 2A and FIG. 2B to FIG. 8A and FIG. 8B.

The adoption of the RIE method in forming the STI trenches causes the by-product to be generated on the sidewalls and the bottom surfaces inside the trenches. If, for example, the whole structure including the substrate 1 is heated in the $O_2$ atmosphere at 1000° C. as is generally known in order to remove this by-product, silicon oxide films 51, 53 having a very small thickness (several nm in thickness) are formed on the sidewalls and the bottom surfaces of the trenches as shown in FIG. 9A and FIG. 9B. The silicon oxide film 51 is formed on the exposed surface of the substrate 1 and the silicon oxide film 53 is formed on the side surfaces of the polycrystalline silicon film 3. Both of the silicon oxide films 51, 53 are formed by composition change of the original silicon (the substrate 1 and the polycrystalline silicon film 3).

When the substrate 1 is exposed to the high temperature, accompanied by such composition change of the silicon, stress concentration is caused on a portion 1a and a portion 1b of the substrate 1 which undergo the change in surface shapes thereof. Then, a crystal distortion is generated toward the inside of the substrate 1 from these portions, and excessive crystal distortion results in the segregation, in a crystal distortion portion, of impurities which are to be implanted in a subsequent process, thereby causing a leak pass to occur.

Figure 10:
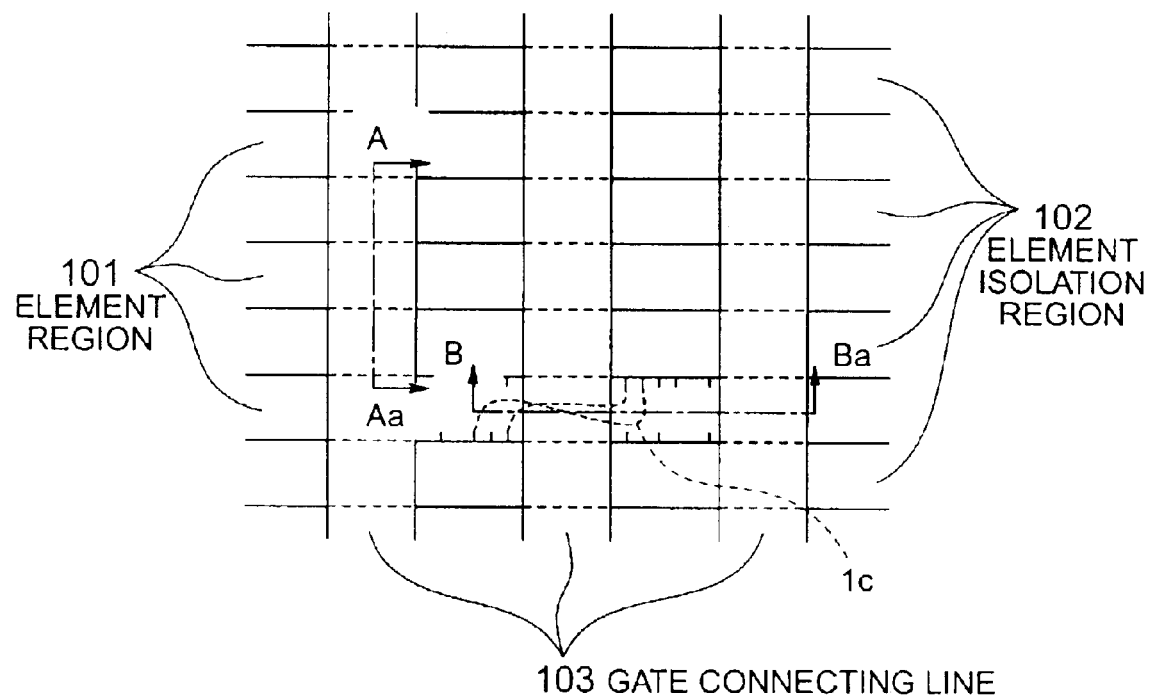
FIG. 10 is a plan view showing the spread of a crystal fault.

FIG. 10 is a plan view showing the spread of such a crystal fault. Specifically, a crystal fault 1c spreading from an element isolation region 102 side of the element region 101 passes under the gate connecting lines 103 (in other words, the channel regions or thereunder) to possibly short-circuit the source/drain regions. Such a short circuit impairs a basic operation and function as a memory element to lower the yield thereof. Especially, as the size of the memory element becomes more shrunk, the distance which has a significant meaning becomes shorter, and consequently, the short-circuit state due to the stress concentration is more likely to occur. In the embodiment explained above, the thermal treatment at the high temperature after the formation of the STI trenches is avoided to reduce the occurrence of such a crystal fault.

Further, there is a possibility that the high temperature treatment after the formation of the STI trenches may be a cause of the deterioration of the first gate insulation film 2 as well as the occurrence of the stress from the substrate 1 side as described above. The first gate insulation film 2 is an insulation film through which electric charge is to tunnel in a predetermined case, and change in electron and hole trap characteristics due to the deterioration in film quality easily causes the generation of a leak current and so on, thereby degrading the characteristic. Taking such a phenomenon into consideration, the above-described high-temperature treatment should be also avoided.

The above-described embodiment, in which these causes for lowering the yield are reduced, is especially suitable for the case when the width of the first gate insulation film 2 is, for example, 200 nm, 160 nm, or smaller.

Figure 11:
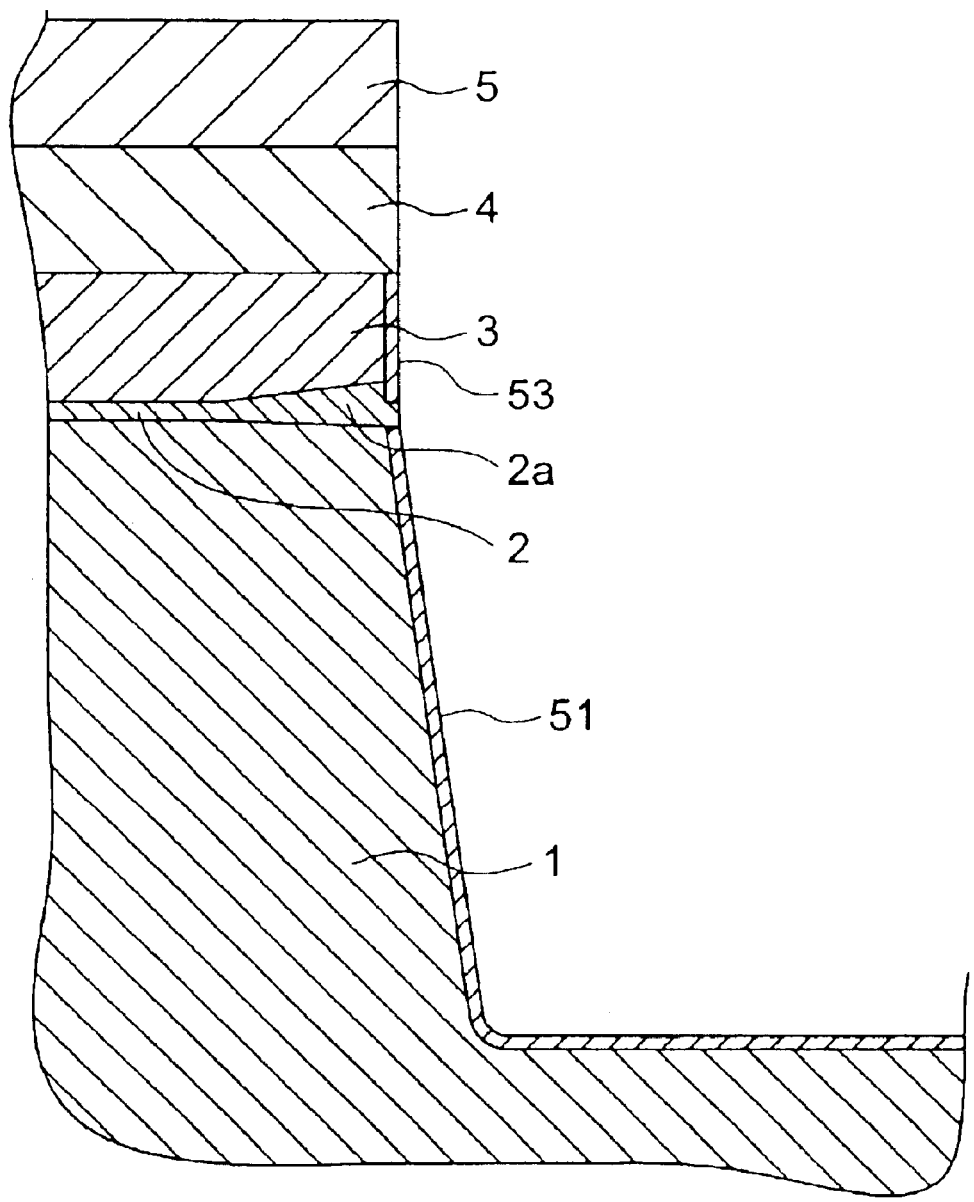
FIG. 11 is a further enlarged cross sectional view of a part of the state shown in FIG. 9A.

FIG. 11 is a further enlarged cross sectional view of a part of the state shown in FIG. 9A. In FIG. 11, the same reference numerals and symbols are used to designate the same portions as those in FIG. 9A. What is to be explained using FIG. 11 is a bird's beak 2a formed in the first gate insulation film 2. The bird's beak 2a is formed near a side surface (of the STI trench side) of the first gate insulation film 2 and is an increased portion of a film thickness thereof. Specifically, FIG. 11 is a view, similarly to FIG. 9A and FIG. 9B which are described above, showing the state in which the silicon oxide films 51, 53 are formed by, for example, the high-temperature thermal treatment in the $O_2$ atmosphere after the STI trenches are formed and a view explaining especially the bird's beak 2a.

When the thermal treatment is carried out to form the silicon oxide films 51, 53, the above-mentioned bird's beak 2a, though small, is formed in the first gate insulation film 2. This is because oxygen atoms which are supplied onto a side surface (of the STI trench side) of the polycrystalline silicon film 3 to oxidize the polycrystalline silicon film 3 are supplied also from the first gate insulation film 2 near an area facing the first gate insulation film 2. Since the first gate insulation film 2 is, for example, oxide silicon and has oxygen as a composition thereof, the oxygen transfers to the polycrystalline silicon film 3. Thus formed oxidized portion of the polycrystalline silicon film 3 comes to have a composition similar to the first gate insulation film 2 to be taken in as the bird's beak 2a of the first gate insulation film 2.

Incidentally, an oxidized portion on the substrate 1 side can be a bird's beak of the first gate insulation film 2 in the same manner, but since the substrate 1 is a monocrystal and is more difficult to be oxidized than a polycrystal, the bird's beak 2a is mainly formed on the polycrystalline silicon film 3 side.

Figure 12:
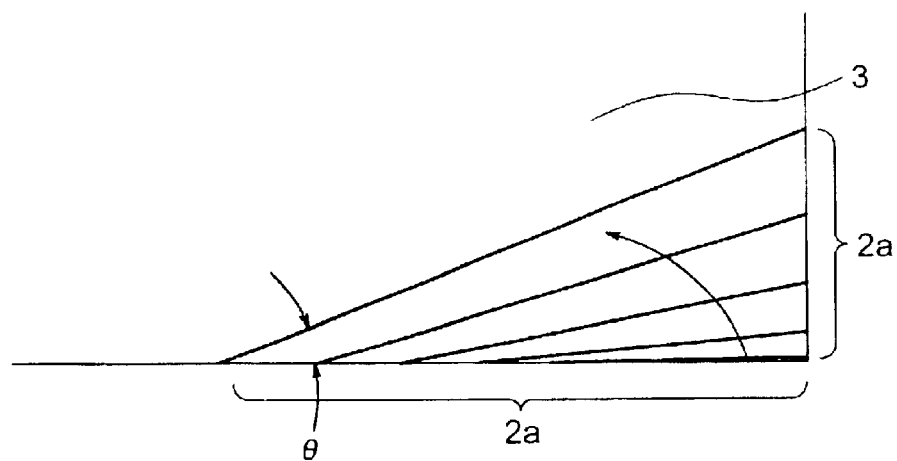
FIG. 12 is an enlarged view schematically showing how an oxidized portion of a polycrystalline silicon film 3 in FIG. 11 contacting with a first gate insulation film 2 grows.

FIG. 12 is an enlarged view schematically showing how the oxidized portion of the polycrystalline silicon film 3 contacting with the first gate insulation film 2 grows. As is shown in FIG. 12, the oxidized portion to be the bird's beak grows so as to increase the bird's beak angle θ and the depth from the STI trenches as the oxidization progresses.

An experiment shows that the bird's beak angle θ in the state where the silicon oxide films 51, 53 having a thickness of several nm are formed by the high-temperature thermal treatment in the $O_2$ atmosphere after the formation of the STI trenches is approximately 4 degrees. Such an angle is less significant as the area of the first gate insulation film 2 is larger (in other words, the degree of the integration as an element is less higher). This is because the depth from the STI trenches is not very large so that the uniformity of the thickness of the first gate insulation film 2 is relatively maintained. (Incidentally, a TEM (transparent electron microscope) is usable for observing the bird's beak angle θ here.)

However, as each element is more scaled down, even the bird's beak angle as small as 4 degrees causes the deterioration in the relative uniformity of the thickness of the first gate insulation film 2. This is because the depth of the bird's beak 2a from the STI trenches becomes nonnegligible relative to the dimension of the first gate insulation film 2. Moreover, difference in the nonnegligible dimension among the formed bird's beaks 2a results in difference in the coupling ratio among the transistors as the nonvolatile semiconductor device. The coupling ratio is defined as the amount expressed as $C_{ONO}/(C_{ONO}+C_{OX})$ where $C_{ONO}$ is the static capacitance of the second gate insulation film 8 of the ONO structure and $C_{ox}$ is the static capacitance of the first gate insulation film 2.

The coupling ratio, as is apparent from the definition thereof, is an index determining a voltage applied to the first gate insulation film 2 at the time of a read operation, and the difference in the coupling ratio results in difference in a read characteristic, which also lowers the yield. In the above-described embodiment, since the high-temperature thermal treatment after the formation of the STI trenches is avoided to radically prevent the formation of the bird's beak 2a, the difference in the coupling ratio is very small. Consequently, this embodiment is especially suitable for forming a microscopic element in which the width of the first gate insulation film 2 is, for example, 200 nm, 160 nm, or smaller. The experiment shows that the depth of the formed bird's beak 2a is 10% of the width of the first gate insulation film 2 at most in any of these cases.

Figure 13:
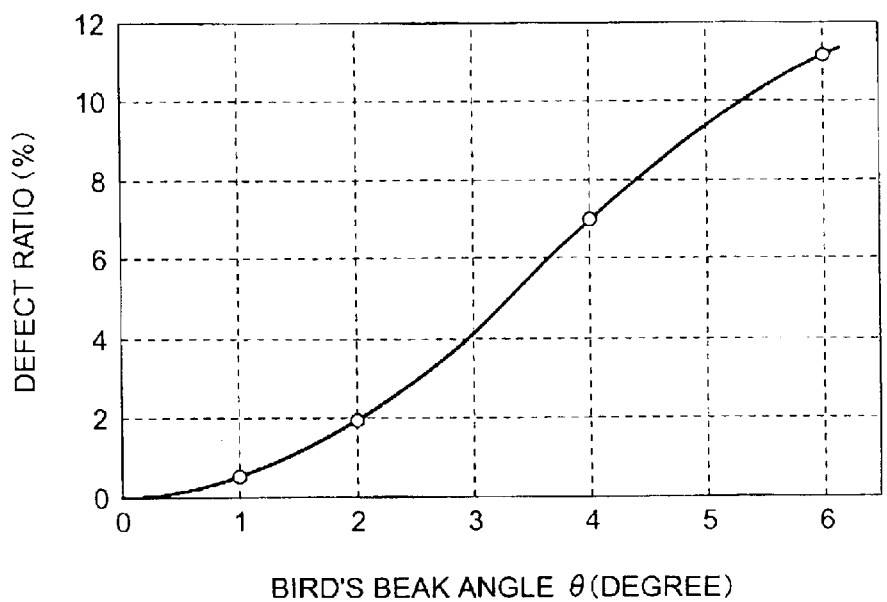
FIG. 13 is a graph showing data indicating a comprehensive defect ratio when an angle θ of a formed bird's beak 2a is varied by varying conditions (temperature, time) in a process of forming silicon oxide films 51, 53 at a high temperature after the STI trenches are formed.

FIG. 13 shows data indicating a comprehensive defect ratio when the angle θ of the formed bird's beak 2a is varied by varying the conditions (temperature, time) of the process of forming the silicon oxide films 51, 53 at a high temperature after the formation of the STI trenches. The comprehensive defect ratio is a defect ratio including all the defects caused by the crystal fault occurring in the substrate 1, the deterioration in the film quality of the first gate insulation film 2, the increase in the difference in the coupling ratio, and so on which are explained above. As is apparent from FIG. 13, as the bird's beak angle θ is smaller (in other words, as the degree of the thermal treatment is smaller), the defect ratio lowers.

Since the thermal treatment for forming the silicon oxide films 51, 53 at a high temperature is not carried out after the STI trenches are formed in the above-described embodiment, substantially the same defect ratio as that in the case of the bird's beak angle θ=0 can be realized. 'Substantially' is added because, after the trenches are formed, various kinds of processes (they are previously explained) are carried out even though the high-temperature thermal treatment for forming the silicon oxide films 51, 53 is not carried out so that, for example, the oxygen atoms are supplied to the polycrystalline silicon film 3 via the silicon oxide film 6, which may possibly cause a very small bird's beak 2a to be generated. The bird's beak angle θ can still be controlled to be approximately 1 degree by controlling the degree of the thermal treatment as is shown in FIG. 13, and consequently, the birds beak angle θ in the case when the thermal treatment for forming the silicon oxide films 51, 53 is not carried out can be controlled to be 1 degree or less at most.

Further, it is more preferable to change the forming conditions with time when the silicon oxide film 6 is deposited by the HDP method as is shown in FIG. 4A and FIG. 4B, though not stated in the explanation on the above embodiment (FIG. 1 to FIG. 8A and FIG. 8B). This is because, when the silicon oxide film 6 is deposited in the STI trenches, for example, with the plasma density being controlled to be low at first, the shape changing speed on the substrate 1 side is low, which also reduces the generated stress. The effect of reducing the stress is as previously explained.

Though the nonvolatile semiconductor memory device is taken for example to explain the embodiment in the above description, the present invention is not limited to the case where the gate electrode layer formed on the first gate insulation film is the floating gate, but is also applicable to other cases (namely, also applicable to the case where it is, for example, a general field effect transistor). Further, the present invention is also applicable to the case where the gate electrode layer in contact with the first gate insulation film is not the polycrystalline silicon film depending on the material of the first gate insulation film.

It is to be understood that the present invention is not intended to be limited to the specific modes which are described here using the drawings, and all changes which come within the meaning and range of equivalency of the following claims are intended to be embraced therein.

What is claimed is:

1. A semiconductor device comprising a plurality of element regions and an element isolation region based on STI which electrically isolates the element regions from each other, each of the element regions comprising:
   a channel region;
   source/drain regions formed to sandwich the channel region in a horizontal direction;
   a gate insulation film which is formed on the channel region and in which an angle of a bird's beak is 1 degree or smaller, the bird's beak being formed from a side of the element isolation region on a surface opposite a surface in contact with the channel region in a horizontal direction substantially perpendicular to the direction in which the source/drain regions sandwich the channel region; and
   a gate electrode layer formed on the gate insulation film.

2. A semiconductor device as set forth in claim 1, wherein the gate electrode layer is in an electrically floating state.

3. A semiconductor device as set forth in claim 1, wherein the gate electrode layer is a polycrystalline silicon film.

4. A semiconductor device as set forth in claim 1, wherein a length of the gate insulation film is 200 nm or shorter in the horizontal direction substantially perpendicular to the direction in which the source/drain regions sandwich the channel region.

5. A semiconductor device as set forth in claim 1, wherein, in the gate insulation film, a depth of the bird's beak from the side of the element isolation region is 10% or smaller relative to a length of the gate insulation film in the horizontal direction substantially perpendicular to the direction in which the source/drain regions sandwich the channel region.

6. A semiconductor device comprising a plurality of element regions and an element isolation region based on STI which electrically isolates the element regions from each other, each of the element regions comprising:
   a channel region;
   source/drain regions formed to sandwich the channel region in a horizontal direction;
   a gate insulation film having a side surface and formed on the channel region with this side surface being continuous with a side surface of the channel region on a side of the element isolation region; and
   a gate electrode layer having a side surface and formed on the gate insulation film with this side surface being continuous with the side surface of the gate insulation film on the side of the element isolation region.

7. A semiconductor device as set forth in claim 6, wherein the gate electrode layer is in an electrically floating state.

8. A semiconductor device as set forth in claim 6, wherein the gate electrode layer is a polycrystalline silicon film.

9. A semiconductor device as set forth in claim 6, wherein a length of the gate insulation film is 200 nm or shorter in the horizontal direction substantially perpendicular to the direction in which the source/drain regions sandwich the channel region.

* * * * *